United States Patent
Willmeroth et al.

(10) Patent No.: US 9,029,944 B2
(45) Date of Patent: May 12, 2015

(54) SUPER JUNCTION SEMICONDUCTOR DEVICE COMPRISING IMPLANTED ZONES

(71) Applicant: Infineon Technologies Austria AG, Villach (AT)

(72) Inventors: Armin Willmeroth, Augsburg (DE); Franz Hirler, Isen (DE); Hans-Joachim Schulze, Taufkirchen (DE); Uwe Wahl, Munich (DE); Winfried Kaindl, Unterhaching (DE)

(73) Assignee: Infineon Technologies Austria AG, Villach (AT)

( * ) Notice: Subject to any disclaimer, the term of this patent is extended or adjusted under 35 U.S.C. 154(b) by 12 days.

(21) Appl. No.: 13/769,601

(22) Filed: Feb. 18, 2013

(65) Prior Publication Data

US 2014/0231909 A1     Aug. 21, 2014

(51) Int. Cl.
| | |
|---|---|
| *H01L 29/06* | (2006.01) |
| *H01L 29/66* | (2006.01) |
| *H01L 29/78* | (2006.01) |

(52) U.S. Cl.
CPC ...... *H01L 29/0634* (2013.01); *H01L 29/66712* (2013.01); *H01L 29/7811* (2013.01)

(58) Field of Classification Search
CPC . H01L 27/1214; H01L 27/0251; H01L 27/12; H01L 23/5228; H01L 28/20; H01L 29/7802; H01L 29/66712; H01L 29/1095; H01L 29/7813; H01L 29/7827

USPC .......................................... 438/268; 257/339
See application file for complete search history.

(56) References Cited

U.S. PATENT DOCUMENTS

| | | | |
|---|---|---|---|
| 6,351,024 B1 | 2/2002 | Ruff et al. | |
| 7,893,488 B2 * | 2/2011 | Hebert ......................... 257/330 |
| 8,008,712 B2 | 8/2011 | Hille et al. | |
| 2001/0005024 A1 | 6/2001 | Bauer et al. | |
| 2001/0005036 A1 | 6/2001 | Porst et al. | |
| 2005/0035405 A1 | 2/2005 | Mauder et al. | |
| 2006/0211179 A1 | 9/2006 | Siemieniec et al. | |
| 2011/0275202 A1 | 11/2011 | Mauder et al. | |
| 2011/0300707 A1 | 12/2011 | Hille et al. | |

FOREIGN PATENT DOCUMENTS

DE     19950579 B4     11/2007

* cited by examiner

*Primary Examiner* — Monica D Harrison

(74) *Attorney, Agent, or Firm* — Murphy, Bilak & Homiller, PLLC

(57) ABSTRACT

In a semiconductor substrate with a first surface and a working surface parallel to the first surface, columnar first and second super junction regions of a first and a second conductivity type are formed. The first and second super junction regions extend in a direction perpendicular to the first surface and form a super junction structure. The semiconductor portion is thinned such that, after the thinning, a distance between the first super junction regions having the second conductivity type and a second surface obtained from the working surface does not exceed 30 μm. Impurities are implanted into the second surface to form one or more implanted zones. The embodiments combine super junction approaches with back-side implants enabled by thin wafer technology.

16 Claims, 13 Drawing Sheets

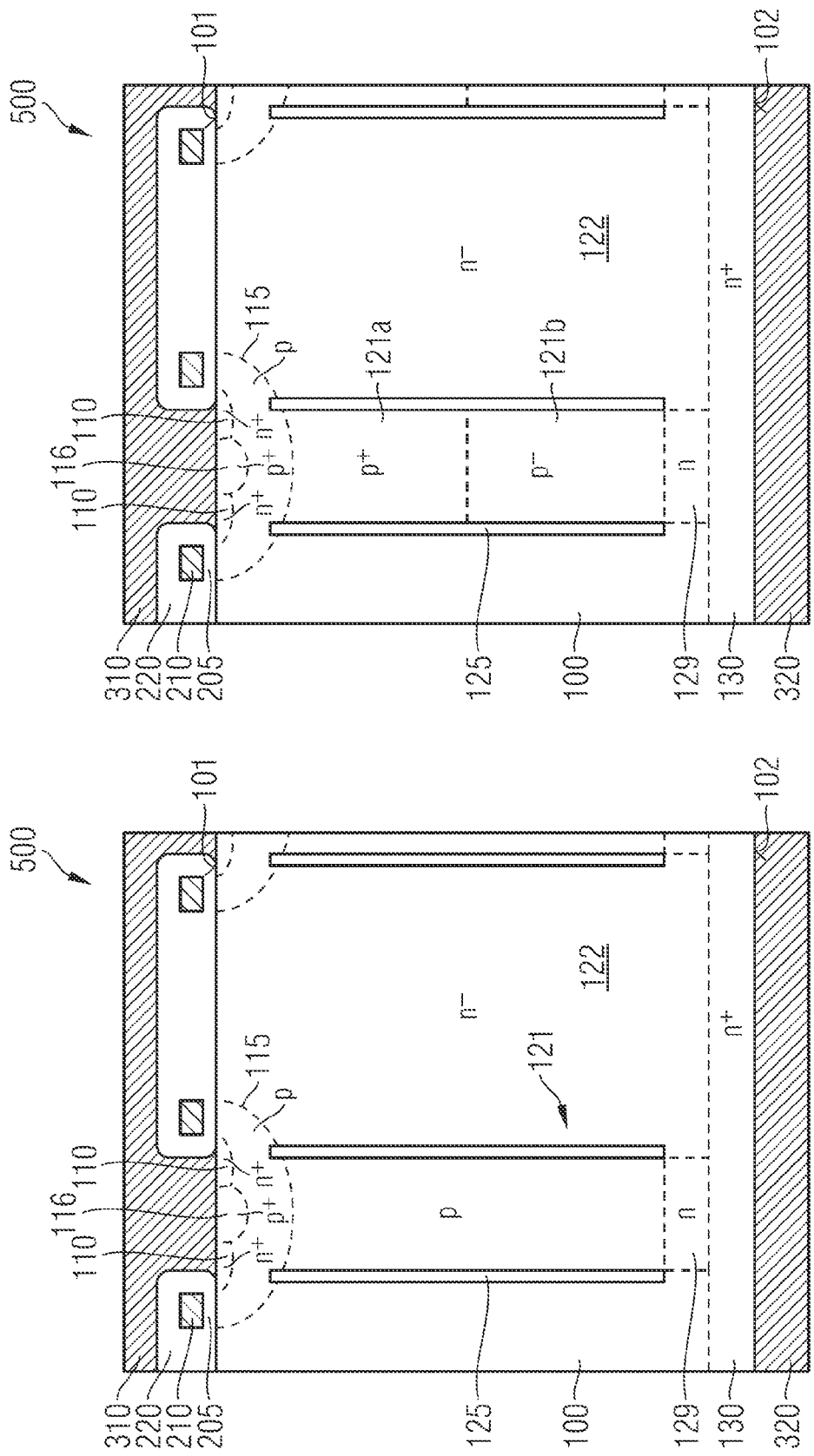

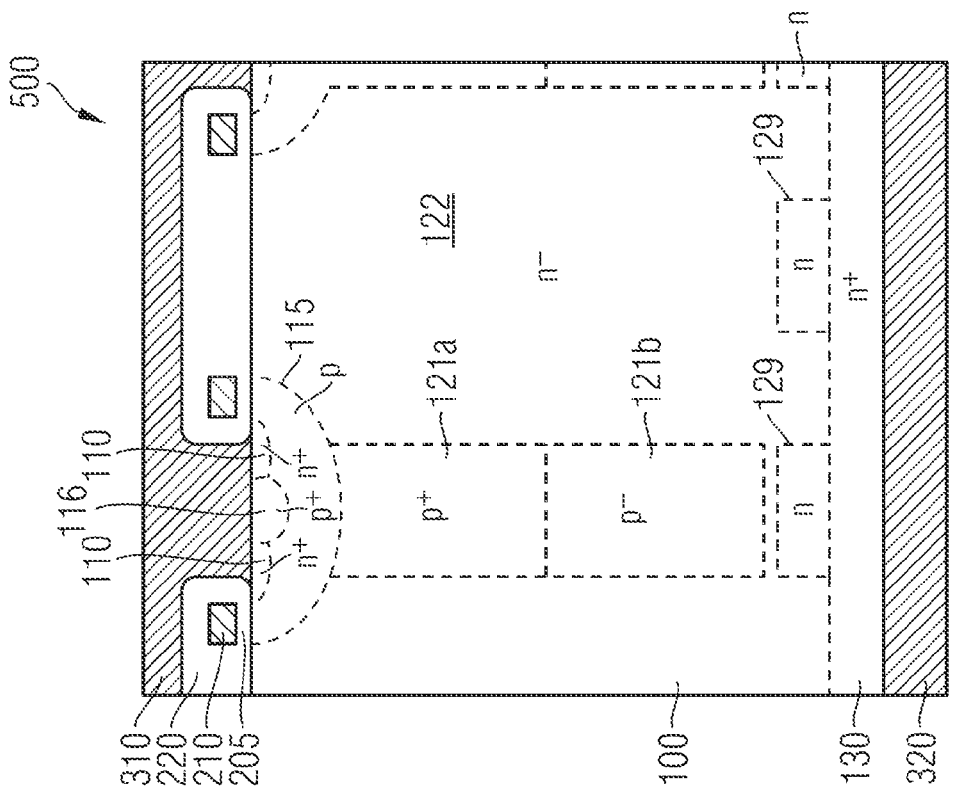
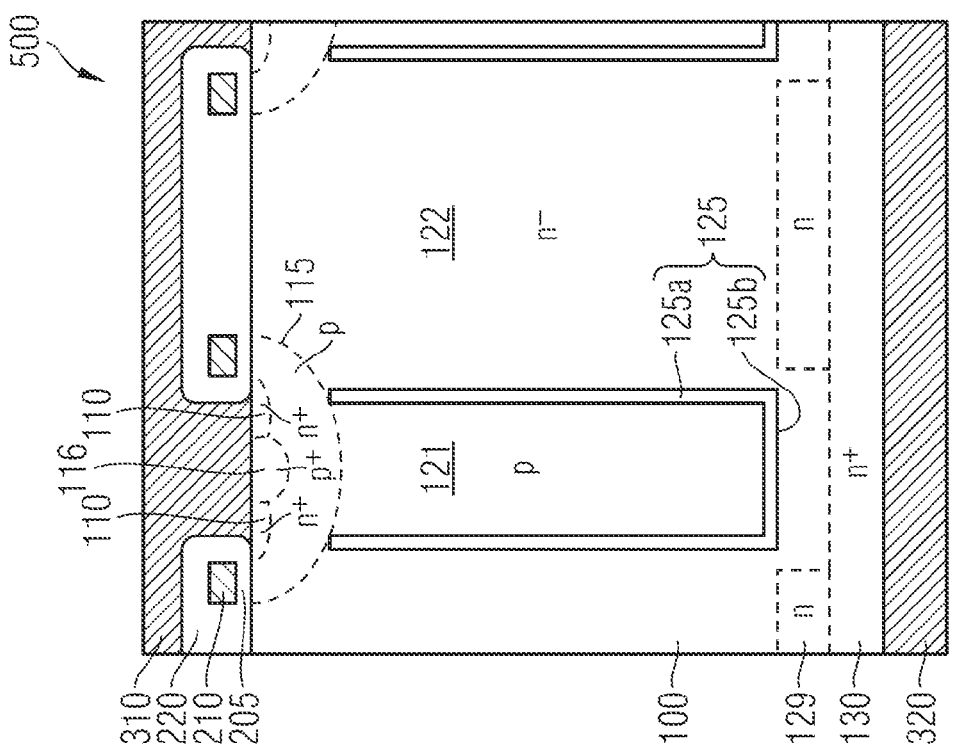

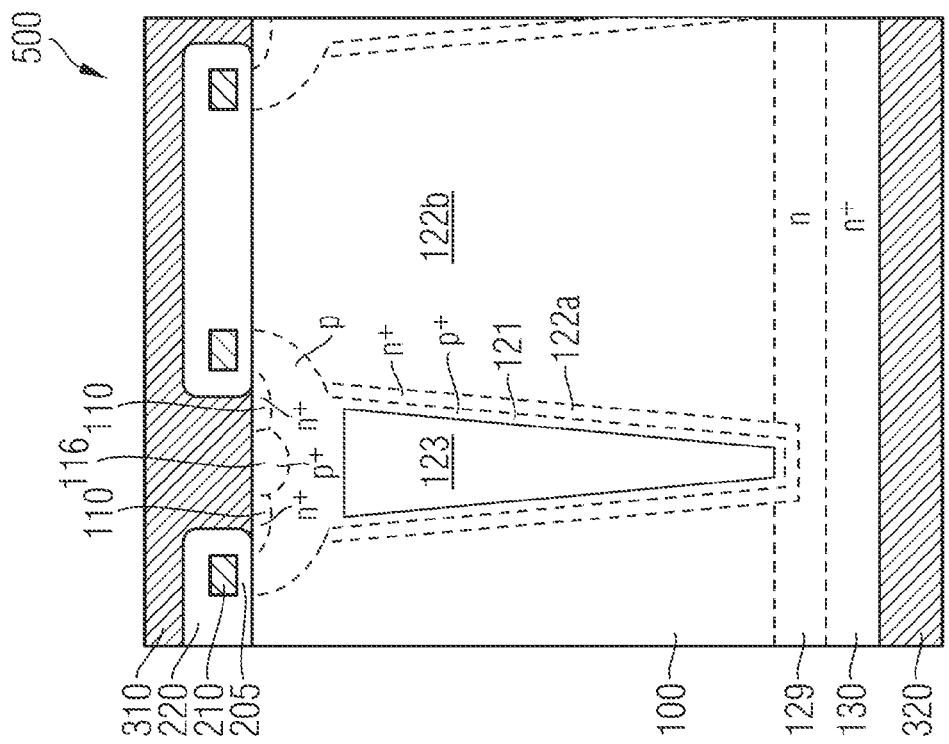
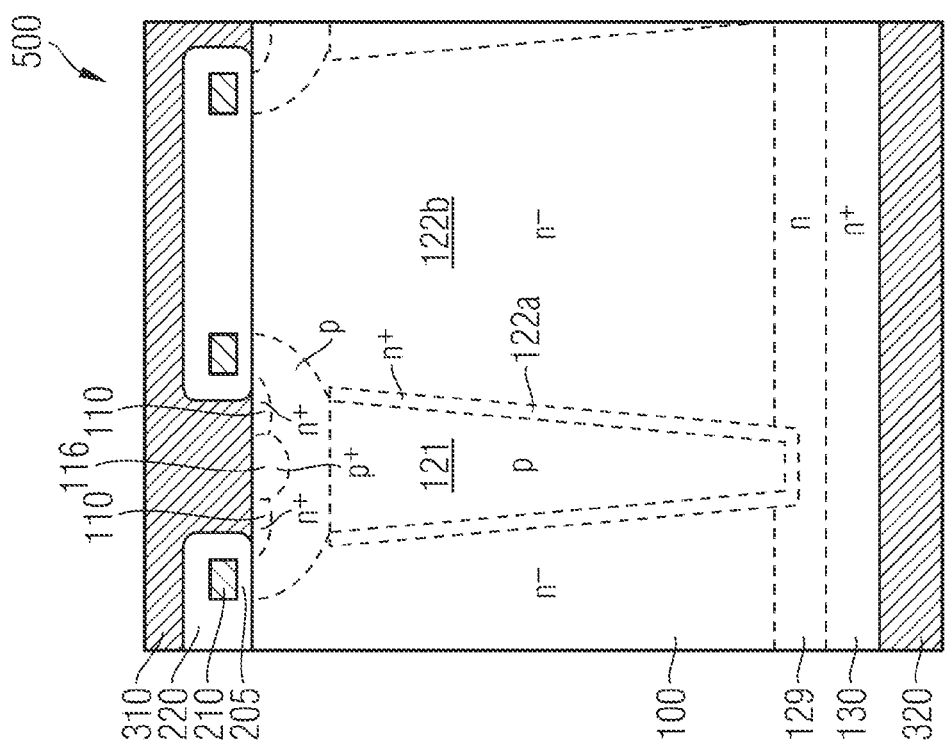

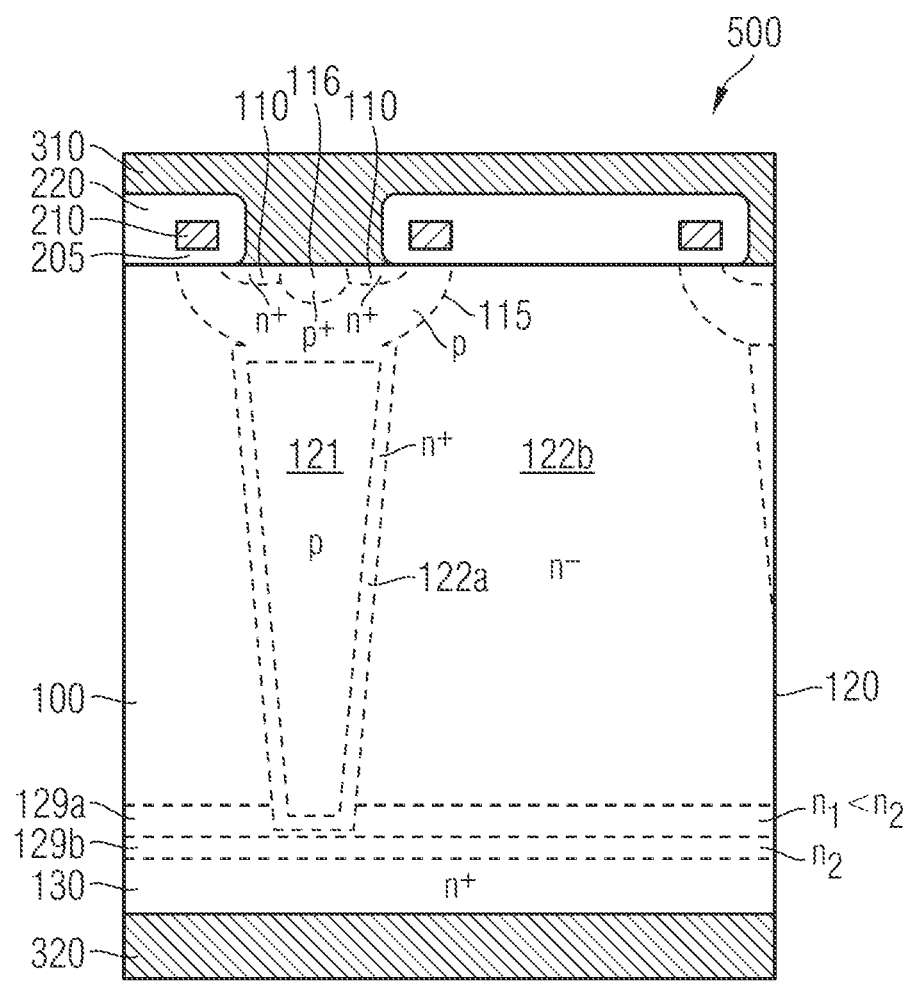

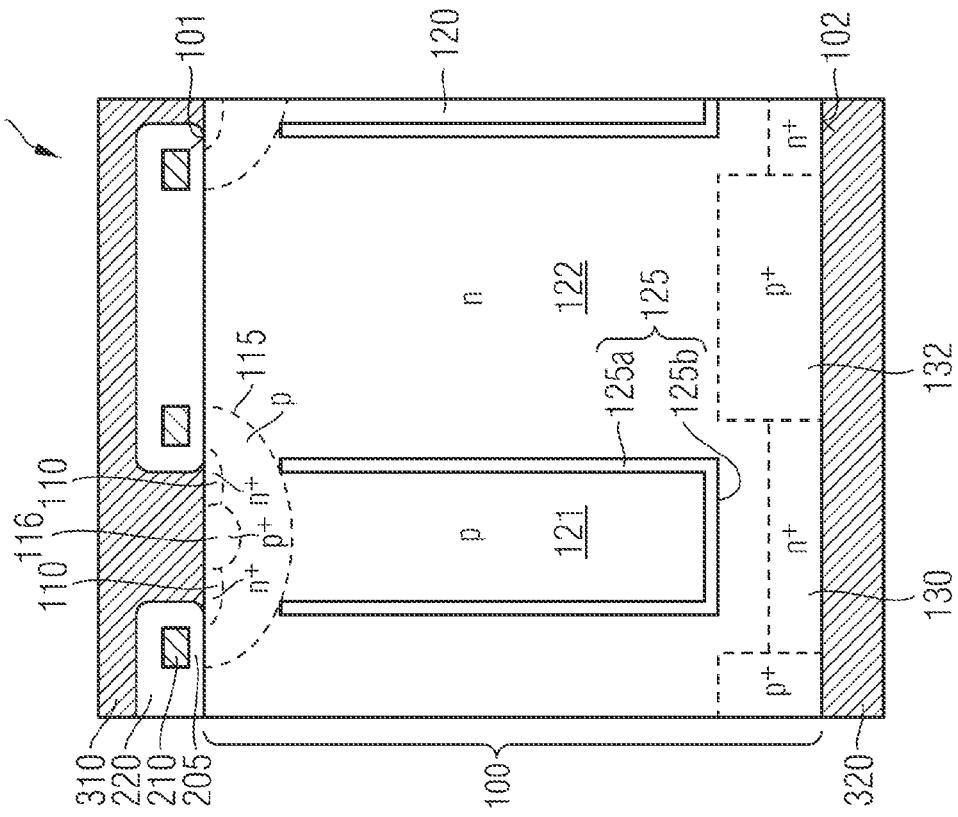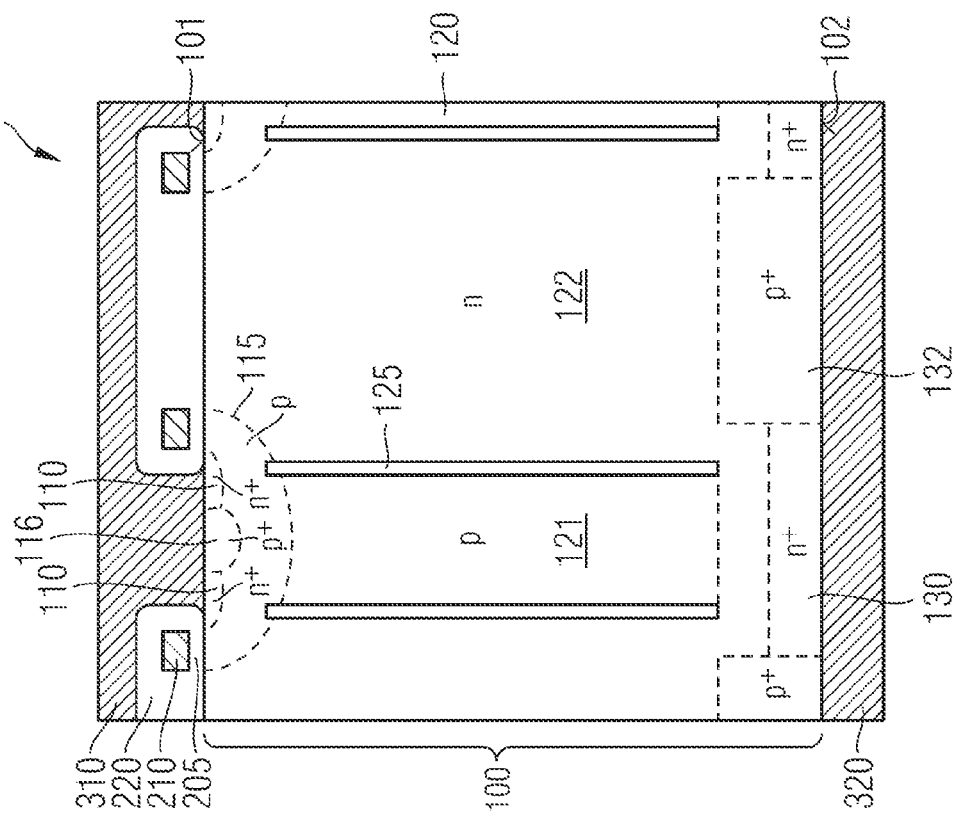

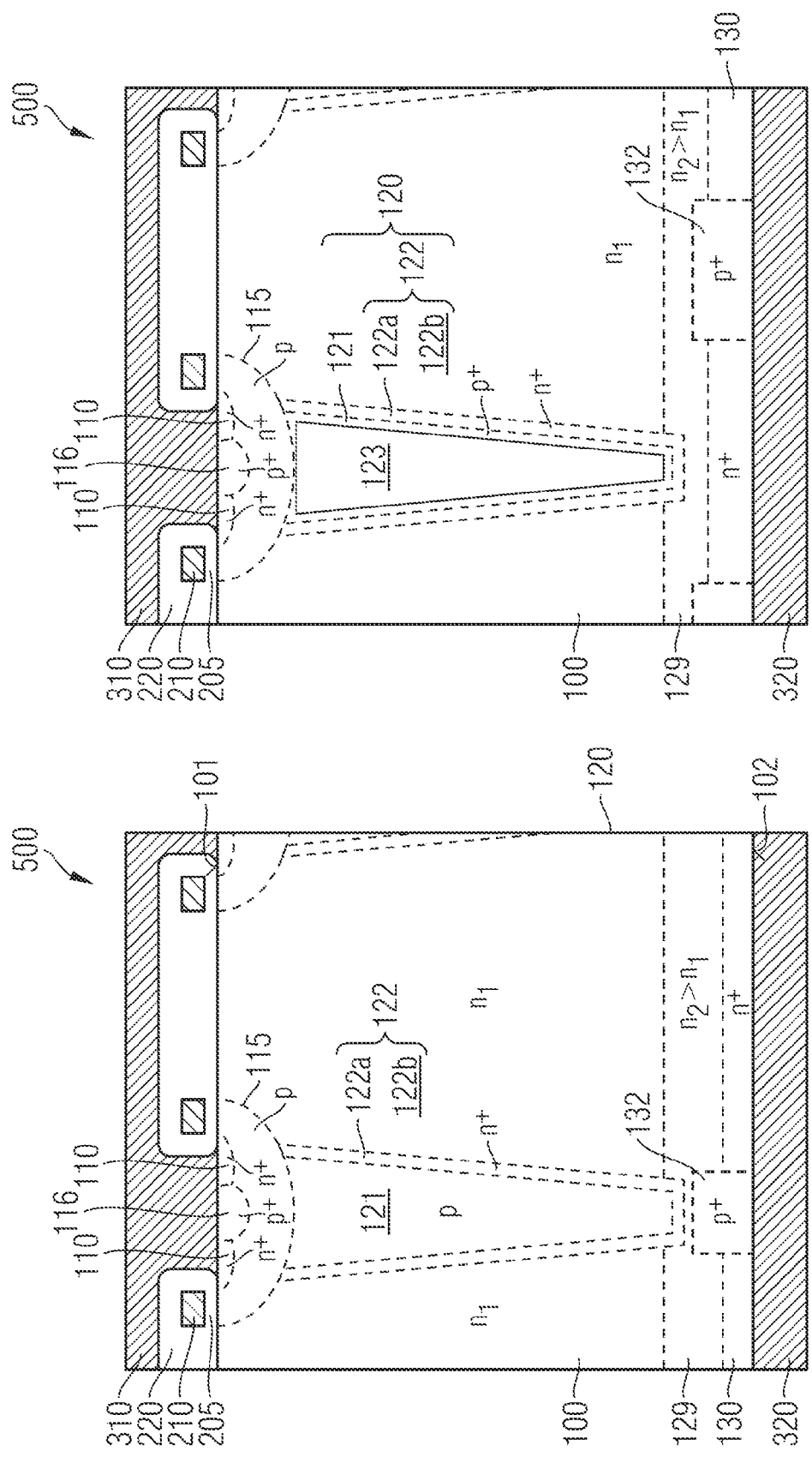

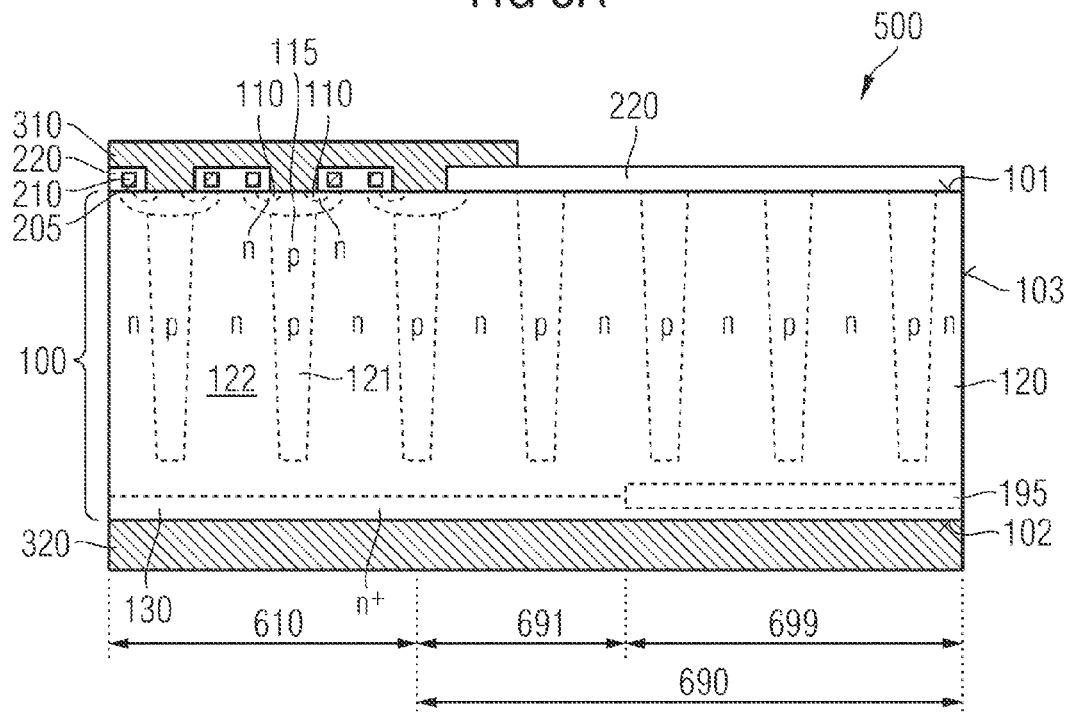
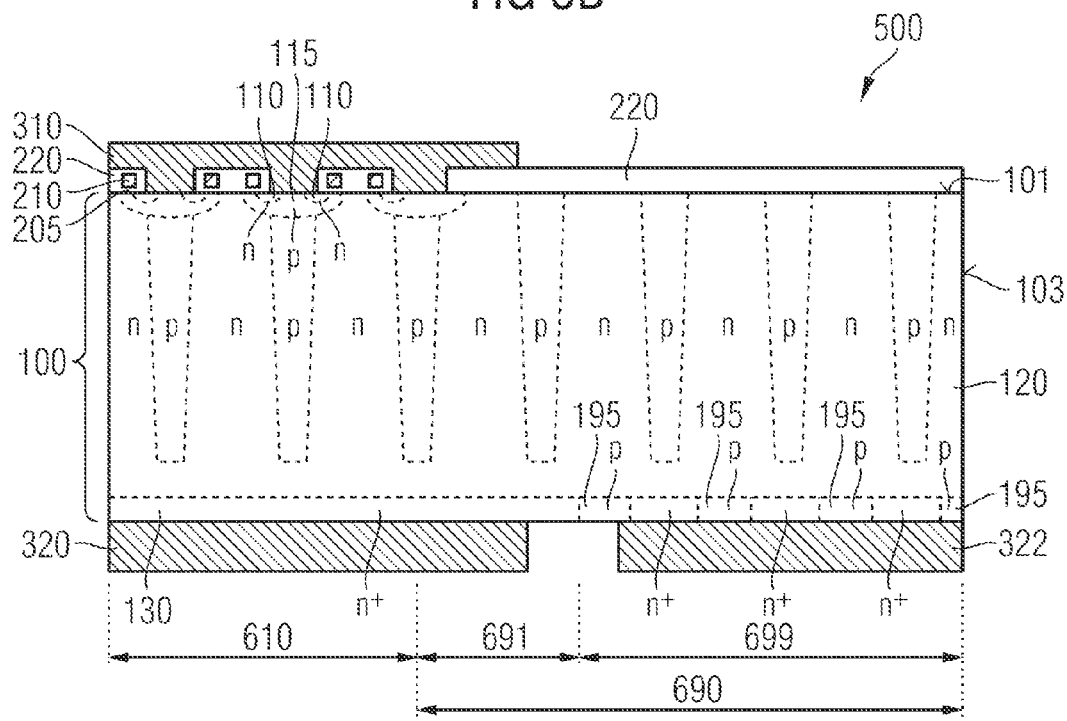

SUPER JUNCTION SEMICONDUCTOR DEVICE COMPRISING IMPLANTED ZONES

BACKGROUND

The drift layer of a super junction semiconductor device includes p-doped columns separated by n-doped columns. A high impurity concentration in the n-doped columns assures a low on-state or forward resistance of the semiconductor device. In the reverse mode depletion zones extend between the p-doped and n-doped columns in a lateral direction such that a high reverse breakdown voltage can be achieved despite the high impurity concentration in the n-doped columns. Super junction semiconductor devices are typically designed for high voltage applications with the resistance in the drift layer dominating the on-state or forward resistance. It is desirable to provide improved super junction semiconductor devices.

SUMMARY

According to an embodiment, a super junction semiconductor device includes a semiconductor portion with a first surface and a second surface parallel to the first surface. The semiconductor portion includes a drain layer of a first conductivity type, which is formed at least in a cell area. Columnar first super junction regions of a second, opposite conductivity type extend in a direction perpendicular to the first surface. Columnar second super junction regions of the first conductivity type separate the first super junction regions from each other. The first and second super junction regions form a super junction structure between the first surface and the drain layer. A distance between the first super junction regions and the second surface does not exceed 30 μm. One or more implanted zones directly adjoin the drain layer.

According to another embodiment, a super junction semiconductor device includes a semiconductor portion with a first surface and a second surface parallel to the first surface. The semiconductor portion includes a drain layer of a first conductivity type in a cell area. The drain layer is absent in an edge area surrounding the cell area. Columnar first super junction regions of a second, opposite conductivity type extend in a direction perpendicular to the first surface. Columnar second super junction regions of the first conductivity type separate the first super junction regions from each other. The first and second super junction regions form a super junction structure between the first surface and the drain layer. A distance between the first super junction regions and the second surface does not exceed 30 μm.

Another embodiment refers to a method of manufacturing a super junction semiconductor device. In a semiconductor portion with a first surface and a working surface parallel to the first surface, columnar first and second super junction regions of a first and a second conductivity type are formed. The first and second super junction regions extend in a direction perpendicular to the first surface and form a super junction structure. The semiconductor portion is thinned from the working surface to obtain a second surface such that, after the thinning, a distance between the first super junction regions having the second conductivity type and the second surface does not exceed 30 μm. Impurities of the first conductivity type are implanted into the second surface to form one or more implanted zones at least between the super junction structure and the second surface at least in a cell area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate several embodiments of the present invention and together with the description serve to explain principles of the invention. Other embodiments of the invention and intended advantages will be readily appreciated as they become better understood by reference to the following detailed description.

FIG. 2A is a schematic cross-sectional view of a portion of a super junction semiconductor device in accordance with an embodiment providing a super junction structure including a dielectric liner.

FIG. 2B is a schematic cross-sectional view of a portion of a super junction semiconductor device in accordance with an embodiment providing a super junction structure with a dielectric liner and super junction regions with graded impurity concentration.

FIG. 2C is a schematic cross-sectional view of a portion of a super junction semiconductor device in accordance with an embodiment providing a dielectric liner enclosing first super junction regions.

FIG. 2D is a schematic cross-sectional view of a portion of a super junction semiconductor device in accordance with an embodiment providing a super junction structure without a dielectric liner.

FIG. 2E is a schematic cross-sectional view of a portion of a super junction semiconductor device in accordance with an embodiment using a heavily n-doped layer for providing the super junction structure.

FIG. 2F is a schematic cross-sectional view of a portion of a super junction semiconductor device in accordance with an embodiment using heavily n-doped and p-doped layers for providing the super junction structure.

FIG. 2G is a schematic cross-sectional view of a portion of a super junction semiconductor device in accordance with an embodiment providing a multi-step field stop structure.

FIG. 3B is a schematic cross-sectional view of a portion of a super junction semiconductor device with the super junction structure of FIG. 2A in combination with counter-doped islands.

FIG. 3C is a schematic cross-sectional view of a portion of a super junction semiconductor device in accordance with an embodiment providing the super junction structure of FIG. 2C in combination with counter-doped islands.

FIG. 3D is a schematic cross-sectional view of a portion of a super junction semiconductor device in accordance with an embodiment providing the super junction structure of FIG. 2E in combination with counter-doped islands.

FIG. 3E is a schematic cross-sectional view of a portion of a super junction semiconductor device in accordance with an embodiment providing the super junction structure of FIG. 2F in combination with counter-doped islands.

FIG. 5A is a schematic cross-sectional view of a portion of a super junction semiconductor device in accordance with an embodiment providing a commutation enhancement zone in an edge area.

FIG. 5B is a schematic cross-sectional view of a portion of a super junction semiconductor device in accordance with an embodiment providing a commutation enhancement zone having an electrical connection.

DETAILED DESCRIPTION

In the following detailed description, reference is made to the accompanying drawings, which form a part hereof, and in which are shown by way of illustration specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet further embodiments. It is intended that the present invention include such modifications and variations. The examples are described using specific language that should not be construed as limiting the scope of the appending claims. The drawings are not scaled, and are for illustrative purposes only. For clarity, the same elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1A:
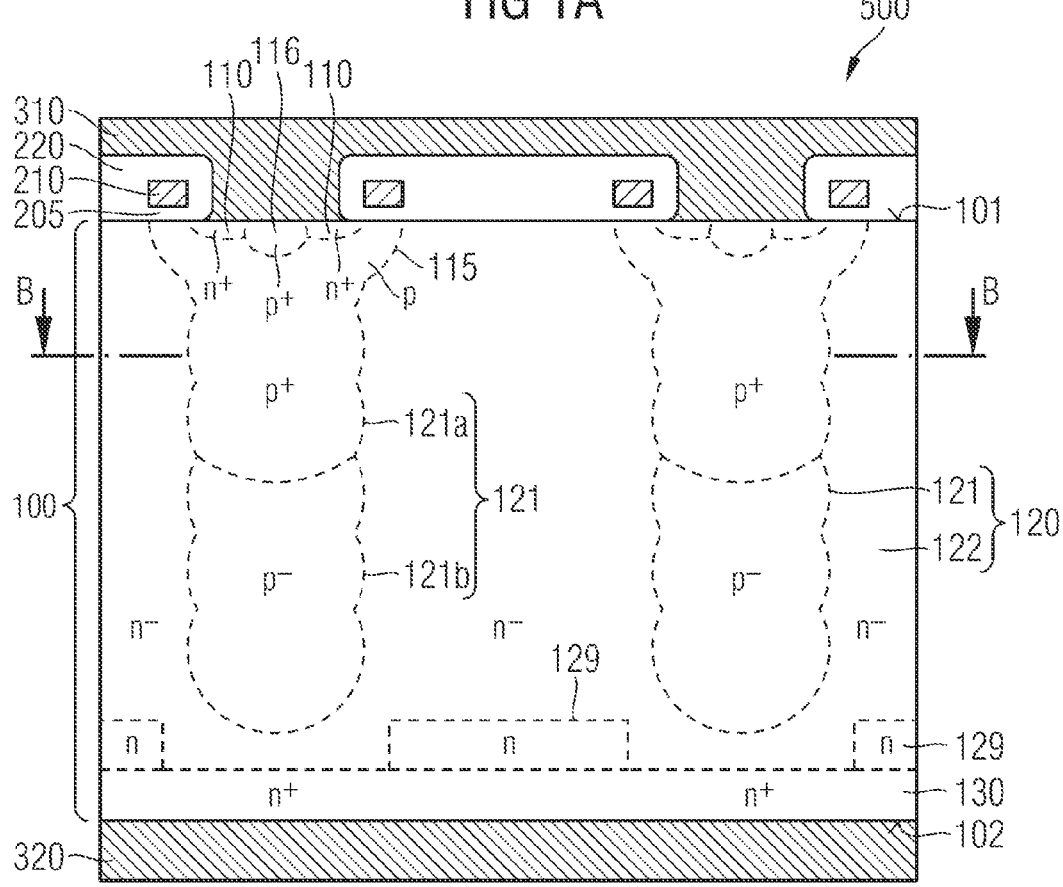
FIG. 1A is a schematic cross-sectional view of a portion of a super junction semiconductor device in accordance with an embodiment providing a segmented field stop structure and a super junction structure provided by repeating a sequence that includes growing sub-layers by epitaxy and implanting impurities using an implant mask.
Figure 1B:
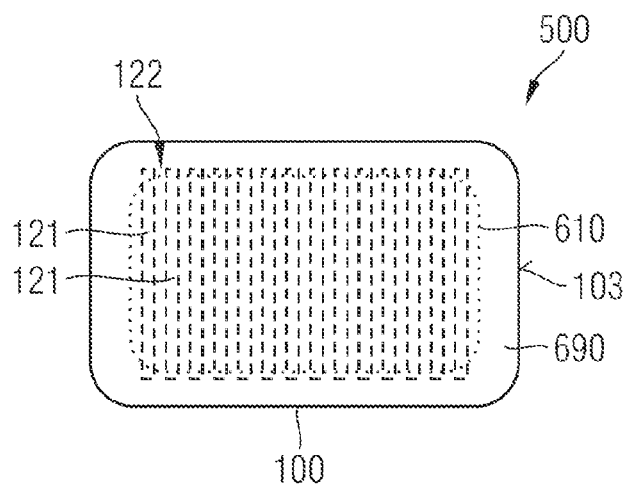
FIG. 1B is a schematic cross-sectional view of a semiconductor portion of the semiconductor device of FIG. 1A along line B-B.

FIGS. 1A and 1B show a super junction semiconductor device 500 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is less than 175 μm, for example at most 100 μm or at most 50 μm. The semiconductor portion 100 may have a rectangular shape with an edge length in the range of several millimeters. The normal to the first and second surfaces 101, 102 defines a vertical direction and directions orthogonal to the normal direction are lateral directions.

The semiconductor portion 100 includes a drain layer 130 of a first conductivity type. The drain layer 130 may extend along a complete cross-sectional plane of the semiconductor portion 100 parallel to the second surface 102. According to an embodiment, the drain layer 130 directly adjoins the second surface 102 and a net impurity concentration in the drain layer 130 is comparatively high, e.g. at least $5 \times 10^{18}$ cm$^{-3}$. According to other embodiments, a further layer may be provided between the drain layer 130 and the second surface 102. For example, a collector layer of a second conductivity type, which is the opposite of the first conductivity type, may be arranged between the drain layer 130 and the second surface 102.

A drift layer 120 is located between the first surface 101 and the drain layer 130. The drift layer 120 includes first super junction regions 121 of the second conductivity type and second super junction regions 122 of the first conductivity type. The first super junction regions 121 may directly adjoin the drain layer 130. According to other embodiments, the first super junction regions 121 are formed in a distance to the drain layer 130 such that the drift layer 120 includes a contiguous portion of the first conductivity type which extends between the buried edges of the first and second super junction regions 121, 122 on the one hand and the drain layer 130 on the other hand. The first and second super junction regions may directly adjoin to each other.

As shown in FIG. 1B, the semiconductor portion 100 may include a cell area 610 and an edge area 690 surrounding the cell area 610 in the lateral directions. The edge area 690 extends along an outer surface 103 of the semiconductor portion 100, wherein the outer surface 103 connects the first and second surfaces 101, 102. The edge area 690 may directly adjoin the cell area 610. According to other embodiments, one or more transition areas may separate the edge and the cell areas 610, 690, wherein the transition areas may include features missing both in the cell area 610 and in the edge area 690.

The first and second super junction regions 121, 122 may be parallel stripes arranged at regular distances. According to other embodiments of the first super junction regions 121, the cross-sections parallel to the first surface 101 may be circles, ellipsoids, ovals or rectangles, e.g. squares, with or without rounded corners, and the second super junction regions 122 form a grid embedding the first super junction regions 121.

The semiconductor portion 100 further includes one or more doped zones 110 formed at least in the cell area 610. The one or more doped zones 110 have the same conductivity type. In an on-state or forward mode of the semiconductor device 500, an on-state or forward current flows between the one or more doped zones 110 and the drain layer 130 through the drift layer 120.

Embodiments concerning a super junction diode provide one single doped zone 110 of the second conductivity type that may form an anode zone directly adjoining the first and second super junction regions 121, 122 in the cell area 610. Embodiments concerning a super junction IGFET (insulated gate field effect transistor) or a super junction IGBT (insulated gate bipolar transistor) device provide a plurality of doped zones 110, wherein each of the doped zones 110 directly adjoins to a base zone 115 of the second conductivity type and each base zone 115 directly adjoins to at least one of the first and one of the second super junction regions 121, 122. At least the doped zones 110 may be exclusively formed within the cell area 610 and may be absent in the edge area 690. The base zones 115 are provided at least in the cell area 610 and may or may not be absent in the edge area 690.

For IGFETs and IGBTs, gate electrode structures 210 may be provided to control a minority charge carrier distribution in the base zone 115 between the doped zones 110 and the corresponding first super junction regions 121. A gate dielectric 205 is formed between the respective gate electrode structure 210 and the corresponding base zone 115. The gate electrode structures 210 may be arranged above the first surface 101. According to other embodiments, the gate electrode structures 210 may be provided in trenches extending from the first surface 101 into the semiconductor portion 100.

A first electrode structure 310 may be electrically connected to the doped zones 110 and the base zones 115 through openings in a dielectric layer 220 covering the gate electrode structures 210. The openings in the dielectric layer 220 are formed between neighboring gate electrode structures 210. Highly doped contact zones 116 of the second conductivity type may be formed within the base zones 115 in direct contact with the first electrode structure 310. The dielectric layer 220 electrically insulates the first electrode structure 310 and the gate electrode structures 210.

A second electrode structure 320 directly adjoins the second surface 102 of the semiconductor portion 100. The second electrode structure 320 may directly adjoin the drain layer 130. According to embodiments related to IGBTs, a collector layer of the second conductivity type may be formed between the drain layer 130 and the second electrode structure 320.

Each of the first and second electrode structures 310, 320 may consist of or contain, as main constituent(s), aluminum Al, copper Cu, or alloys of aluminum or copper, for example AlSi, AlCu or AlSiCu. According to other embodiments, one or both of the first and second electrode structures 310, 320 may contain, as main constituent(s), nickel Ni, titanium Ti, silver Ag, gold Au, platinum Pt and/or palladium Pd. For example, in some embodiments at least one of the first and second electrode structures 310, 320 includes two or more sub-layers, each sub-layer containing one or more of Ni, Ti, Ag, Au, Pt, and Pd as main constituent(s), e.g. silicides and/or alloys therefrom.

According to the illustrated embodiment, the first conductivity type is the n-type, the second conductivity type is the p-type, the first electrode structure 310 is a source electrode, the doped zones 110 are source zones and the second electrode structure 320 is a drain electrode. According to other embodiments, the first conductivity type is the p-type.

In addition, the semiconductor portion 100 includes one or more implanted zones that directly adjoin the drain layer 130.

FIG. 1A shows the implanted zones forming a field stop structure 129, which is of the first conductivity type. The field stop structure 129 directly adjoins the drain layer 130 and has a mean impurity concentration that is at most 10 percent of a maximum impurity concentration in the drain layer 130. For example, the mean impurity concentration is between $5 \times 10^{14}$ cm$^{-3}$ and $5 \times 10^{15}$ cm$^{-3}$.

Conventional approaches provide a drain layer from a heavily doped substrate acting as a base layer for growing the drift layer by epitaxy, wherein the thickness of such drain layer is at least 30 µm. In addition, conventional approaches typically provide a field stop layer before the formation of the drift layer 120 and the super junction regions 121, 122 such that the field stop layer is subjected to a high temperature budget required for the formation of the super junction structure and the doped zones within the semiconductor portion 100. The high temperature load results in smooth dopant profiles and less precisely defined zone boundaries in both the vertical and the lateral directions.

Instead, manufacture of the super junction semiconductor device 500 starts with forming, in a semiconductor substrate, the columnar first and second super junction regions 121, 122 of a first and second conductivity type such that the first and second super junction regions 121, 122 extend in a direction perpendicular to a first surface of the semiconductor substrate and form a super junction structure close to the first surface. Then the semiconductor substrate is thinned starting from a working surface opposite to the first surface in order to obtain, from the semiconductor substrate, a semiconductor portion 100. After the thinning, a distance between the first super junction regions 121 and the second surface 102 of the semiconductor portion 100 opposite to the first surface 101 does not exceed 30 µm.

The drain layer 130 may be formed, for example, by an implant into the second surface 102. The thickness of the drain layer 130 may be less than 20 µm, for example less than 10 µm. According to an embodiment the drain layer 130 has an impurity profile with a maximum at a distance to the second surface 102. Since in low-voltage applications the substrate resistance typically dominates the on-state or forward resistance of a semiconductor device and since super junction structures further reduce the contribution of the drift layer to the on-state or forward resistance, combining thinned substrates with super junction approaches results in very low on-state and forward resistance.

The one or more implanted zones for the field stop structure 129 are formed by implanting impurities into the second surface 102. According to an embodiment the field stop structure 129 has an impurity profile with a maximum at a distance to the drain layer 130. Since at this stage of the manufacturing process the other doped zones have been already formed, the field stop structure 129 is subjected to only a low temperature budget, has steeper impurity profiles, and can be defined more precisely and more narrowly in both the vertical and the lateral directions. The vertical extension of the field stop structure 129 may be less than 20 µm, for example less than 10 µm.

Since the overall area dose in the field stop structure 129 is, e.g., between $10^{12}$ and $2 \times 10^{12}$ cm$^{-2}$, the resistance of the field stop structure 129 increases with the thickness. The positive effect of a steeper and thinner field stop structure 129 is a lower on-resistance. For example, for a semiconductor device capable of withstanding 600 V the drain layer 130 may have a thickness from 40 µm to 50 µm and the thickness of the field stop structure 129 may be from 1 to 3 µm.

According to an embodiment, one implanted zone forms a contiguous field stop structure 129 oriented parallel to the second surface 102. According to other embodiments, a masked implant is performed to obtain a plurality of spatially separated implanted zones forming a segmented field stop structure 129. Implanting the field stop structure 129 from the second surface 102 allows precisely fitting an appropriate field stop structure 129 within the comparatively narrow space between the super junction structure and the drain layer 130, which distance may be less than 20 μm, e.g. be less than 10 μm. When a reverse voltage is applied, the field stop structure 129 prevents a depletion zone extending from the pn-junctions of the super junction structure in the vertical direction towards the second surface from reaching the drain layer 130 and ensures a soft switching behavior of the semiconductor device 500.

FIGS. 1A and 1B refer to an embodiment providing the first and second super junction regions 121, 122 by repeating a sequence including growing a sub-layer by epitaxy and implanting impurities of at least one conductivity type into a surface of the sub-layer using an implant mask, wherein the super junction structure is obtained by diffusing at least one of the first and second super junction regions 121, 122 from the implants. As a consequence, the impurity profile in at least one of the first and second super junction regions 121, 122 may be undulated in the vertical, and/or lateral direction as indicated in FIG. 1A.

The field stop structure 129 may be formed by an unmasked implant, wherein the impurities are implanted into the whole second surface 102. According to another embodiment, an implant mask masks the implant. Portions of the field stop structure 129 may be provided in a vertical projection of the first and/or second super junction regions 121, 122. The implant may be performed using an ion beam, wherein an acceleration voltage determines the depth of the implant. The implant may be a one-stage implant using one single acceleration voltage or multiple-stage implants using different acceleration voltages. The implanted field stop structure 129 may be combined with any kind of super junction structure provided by epitaxial growth or by trench technologies with/ without dielectric liners between the super junction regions.

Phosphorus P and/or arsenic As atoms/ions may be implanted to form the field stop structure 129. According to an embodiment, the field stop structure 129 is defined by impurities requiring a low temperature budget for implant and activation, for example protons H and/or helium He. For example, acceleration voltages of less than 1.5 MeV suffice to implant protons H at a distance to the second surface 102 of about 20 μm. Activation and annealing of a proton implant is typically performed at temperatures from 350 degree Celsius to 550 degree Celsius.

According to another embodiment, the field stop structure 129 is formed by implanting impurities having a donor level that is between the valence band edge and the conduction band edge of the semiconductor material and differs from the conduction band edge by at least 200 mV. For example, for silicon Si as the semiconductor material, the impurities are sulfur S or selenium Se. In silicon, S and Se impurities are only active in the reverse mode for preventing the depletion zone to reach the drain layer 130, whereas in the forward or on-state mode, the impurities adversely affect the on-state of forward resistance only to a low degree compared with phosphorus or arsenic. Annealing and activation of S and Se implants is performed at comparatively low temperatures. A thin substrate portion 100 having a thickness of less than 150 micrometer can be provided with field stop structures 129 without using critical temperature budgets which could degrade previously formed super junction regions 121, 122 and further doped zones formed along the first surface 101 of the semiconductor portion 100.

FIGS. 2A to 2G refer to super junction structures obtained by trench approaches providing non-undulated impurity profiles, wherein trenches are introduced into a semiconductor substrate from a direction given by the first surface of a semiconductor portion obtained from the semiconductor substrate.

For example, the super junction semiconductor device 500 of FIG. 2A may be obtained by etching trenches into an n-type semiconductor substrate, lining at least sidewalls of the etched trenches with a dielectric liner 125 and then growing by epitaxy single-crystalline p-doped semiconductor material in the trenches to form the first super junction regions 121. The first super junction regions 121 may be homogenously doped. Each first super junction region 121 may directly adjoin a portion of a segmented field stop structure 129 formed in its vertical projection. The field stop structure 129 may include portions directly adjoining the drain layer 130 in the projection of the first super junction regions 121. The field stop structure 129 may be completely absent in the projection of the second super junction regions 122.

FIG. 2B shows a super junction semiconductor device 500 with a first portion 121a of the first super junction regions 121 oriented to the first surface 101 having a higher impurity concentration than a second portion 121b oriented to the second surface 102. Other embodiments may provide first super junction regions 121 with more than two portions of different impurity concentrations or with smoothly varying impurity profiles.

FIG. 2C shows a super junction device 500 including a dielectric liner 125 that lines trenches introduced into a semiconductor portion 100 from a direction given by the first surface 101 and that includes a sidewall portion 125a covering a sidewall of the trench and a bottom portion 125b extending at the bottom of the trench in substance parallel to the second surface 102 and closing the trench at the bottom. As a result, the dielectric liner 125 encloses the first super junction regions 121 in the drift layer 120 completely. Between the first super junction regions 121 and the first surface 101, base zones 115 or doped zones 110 may be formed that directly adjoin the first super junction regions 121.

The field stop structure 129 may be segmented with each segment located in the vertical projection of one of the second super junction regions 122. The field stop structure 129 may be absent in the projection of the first super junction regions 121.

The super junction semiconductor device 500 of FIG. 2D provides a segmented field stop structure 129 with each segment arranged in the projection of one of the first and second super junction regions 121, 122. The first super junction regions 121 directly adjoin the adjacent second super junction regions 122 and include a highly doped first portion 121a oriented to the first surface 101 and a lower doped second portion 121b oriented to the second surface 102. The super junction structure may be provided by growing a p-doped semiconductor material in a trench introduced from a direction given by the first surface 101.

FIG. 2E shows a contiguous field stop structure 129 having an interface to the drift layer 120 which in substance is parallel to the second surface 102. A heavily n-doped layer 122a of a semiconductor material is provided, for example by growing by epitaxy silicon on a trench sidewall or by implanting impurities into the trench sidewall. The trench extends between the base zone 115 and the field stop structure 129 and may extend into the field stop structure 129. The heavily n-doped layer 122a forms part of the second super junction regions 122. The first super junction regions 121 may be formed by growing by epitaxy a single crystalline p-type semiconductor material within the trenches.

The super junction semiconductor device 500 of FIG. 2F differs from that in FIG. 2E in that the first super junction regions 121 are formed as a heavily doped layer lining the trench and directly adjoining a heavily doped n-doped layer 122a. The heavily doped layer forming the first super junction regions 121 may be formed by an angled implant into the sidewalls and the bottom of the trenches after providing, e.g. by implant or epitaxial growth, the heavily doped portions 122a of the second super junction regions 122. Then a further epitaxial layer may be grown that closes the trenches to form voids 123. In the epitaxial layer grown above the voids 123, doped zones 110 and base zones 115 may be formed.

The super junction device 500 shown in FIG. 2G includes the super junction structure of FIG. 2E. The field stop structure 129 includes a lower doped first portion 129a directly adjoining the drift layer 120 and a stronger doped second portion 129b directly adjoining the drain layer 130, wherein an interface between the first and the second portions 129a, 129b is in substance parallel to the second surface 102.

Other embodiments provide a laser fusing process to anneal the implanted field stop structures 129. For example, the implanted impurities contain selenium Se, phosphorus P atoms/ions or both in combination. The laser anneal reduces the thermal stress and is applicable for thin silicon wafers including the substrate portions.

The field stop structure 129 may extend into the first super junction regions 121, wherein a lower portion of the first super junction regions 121 changes from the second conductivity type to the first conductivity type. This allows providing a field stop structure 129 even when the thinning stops self-aligned at an edge of a depletion zone formed between the first and second super junction regions 121, 122.

FIGS. 3A to 3E refer to embodiments of super junction devices 500 with the implanted zones forming counter-doped islands 132 of the second conductivity type. The counter-doped islands 132 directly adjoin the second surface 102, are separated by portions of the drain layer 130, and are directly electrically connected to the second electrode structure 320.

At current densities exceeding a threshold, the counter-doped islands 132 inject charge carriers into the drift layer 120. Since the injected charge carriers increase the density of free charge carriers in the drift zone 120 the counter-doped islands 132 reduce the on-state/forward resistance at current densities exceeding the threshold. According to embodiments providing n-FETs (field effect transistors), the counter-doped islands are p-doped.

Conventional super junction devices with substrate portions having a thickness greater than 175 μm typically provide floating counter-doped islands embedded between the drift layer 120 and the drain layer 130. In the case of floating counter-doped islands only a Zener breakthrough electrically connects the floating counter-doped islands to the drain layer 130 such that the counter-doped islands can inject charge carriers into the drift layer 120. Therefore conventional, floating counter-doped islands become active only at comparatively high current densities which generate a voltage drop sufficient to trigger the Zener breakthrough. Since usually the floating counter-doped islands 132 are provided at an early stage of the processing and are subject to a high temperature budget, the pn-junction between the floating counter-doped islands and the drain layer is shallow, resulting in a comparatively high Zener breakthrough voltage. Hence, charge carrier injection only takes place at high voltage drops over the substrate portion.

According to some embodiments the substrate portion 100 is thinned to a thickness of less than 175 μm and the processing at the second surface 102 allows implantation of the counter-doped islands 135 directly through the second surface 102 after the thinning of the substrate portion 100.

The counter-doped islands 132 can be directly electrically connected to the second electrode structure 320. As a result, the counter-doped islands 132 start injecting charge carriers at a voltage drop of about 0.6 V, which is significantly less than the Zener breakthrough voltage in conventional designs. The counter-doped islands 132 inject charge carriers at lower current densities and, as a result, reduce the on-state/forward resistance at yet lower current densities than conventional approaches.

Figure 3A:
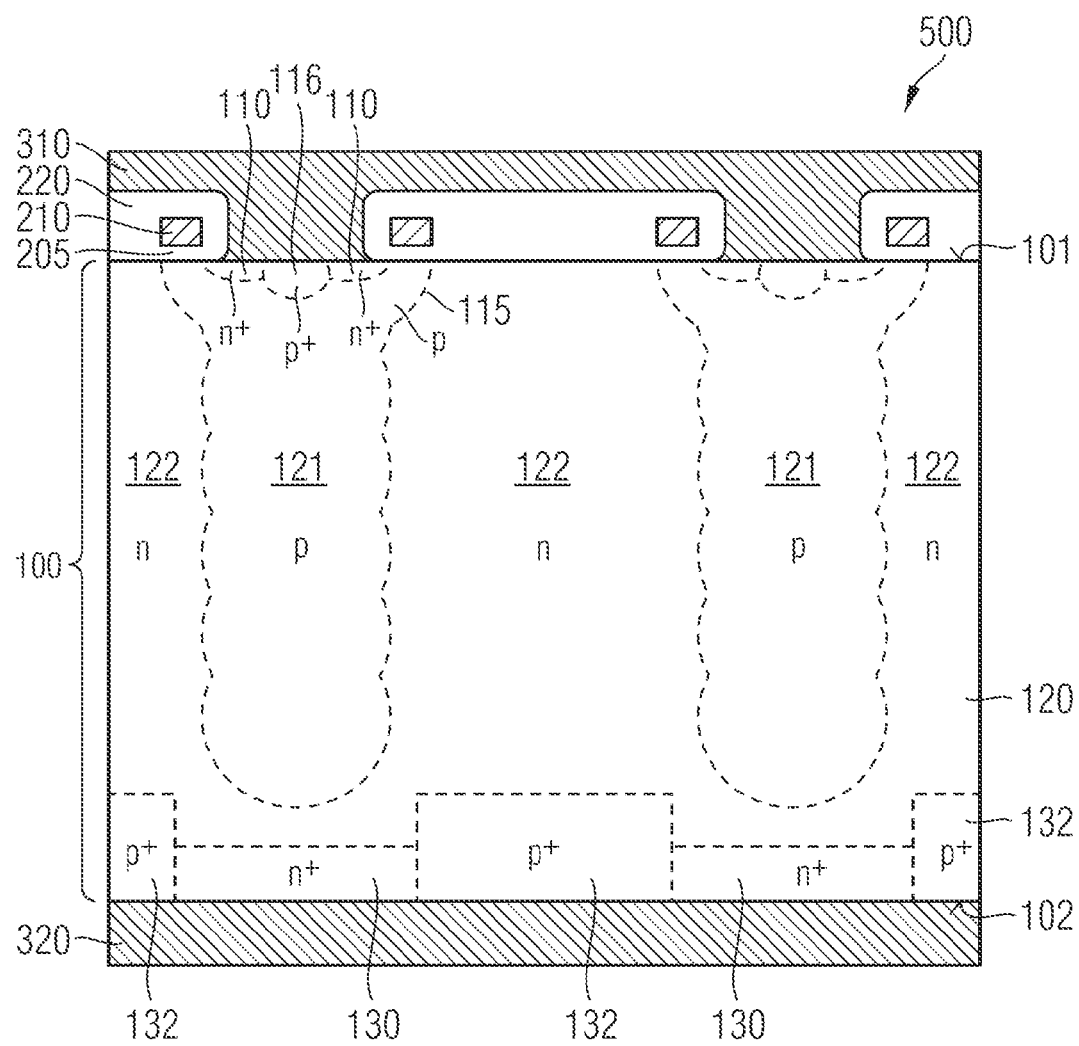
FIG. 3A is a schematic cross-sectional view of a portion of a super junction semiconductor device providing the super junction structure of FIG. 1A in combination with counter-doped islands.

The counter-doped islands 132 may be located in the vertical projection of the second super junction region 122 as illustrated in FIGS. 3A, 3B, 3C, 3E or in the vertical projection of the first super junction regions 121 as illustrated in FIG. 3D. Portions of the drain layer 130 separate the counter-doped islands 132. The drain layer 130 may form a grid embedding the counter-doped island 132. A maximum impurity concentration in the counter-doped islands may be at least $5 \times 10^{17}$ cm$^{-3}$. The portions of the drain layer 130 separating the counter-doped islands ensure a current path to the second electrode structure 320 at low current densities. The counter-doped islands 132 may be combined with a field stop structure 129 blocking a punch-through of the electric field into the counter-doped island 132 as shown in FIGS. 3D and 3E by way of example.

The counter-doped islands 132 may be combined with a plurality of super junction approaches, for example with super junction structures providing at least one of the first and second super junction structures 121, 122 by repeating a sequence including epitaxial growth of sub-layers and masked implant of impurities into the sub-layers as shown in FIG. 3A, with trench approaches providing dielectric liners 125 at vertical sidewalls of a trench extending into the semiconductor portion 100 as shown in FIGS. 3B and 3C, with trench approaches without dielectric liner 125 as shown in FIGS. 3D and 3E, or with any of the other approaches as discussed above.

Figure 3F:
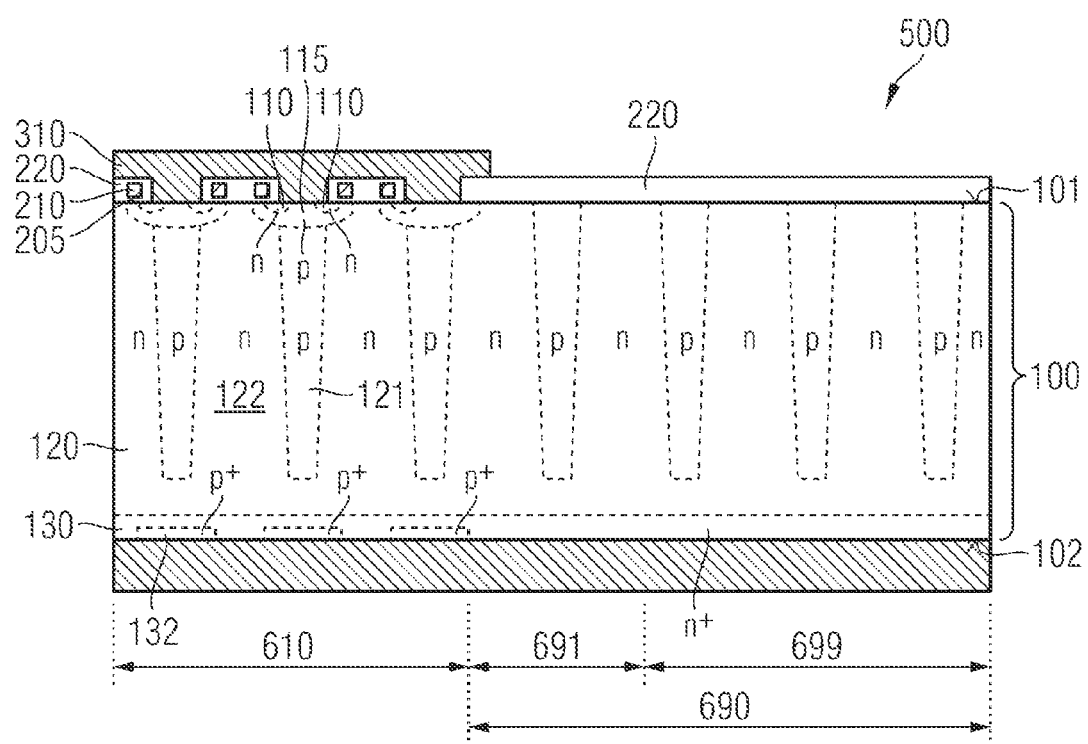
FIG. 3F is a schematic cross-sectional view through a portion of a cell area and an edge area of a super junction semiconductor device in accordance with an embodiment providing counter-doped islands in the cell area.

The counter-doped islands 132 may be formed in both the cell area 610 and the edge area 690. According to other embodiments, the counter-doped islands 132 are exclusively formed in the cell area 610 and are absent in the edge area 690, as shown in FIG. 3F, in order to avoid injection of charge carriers into the edge area 690, which have to be drained off when switching into the reverse state.

Figure 4:
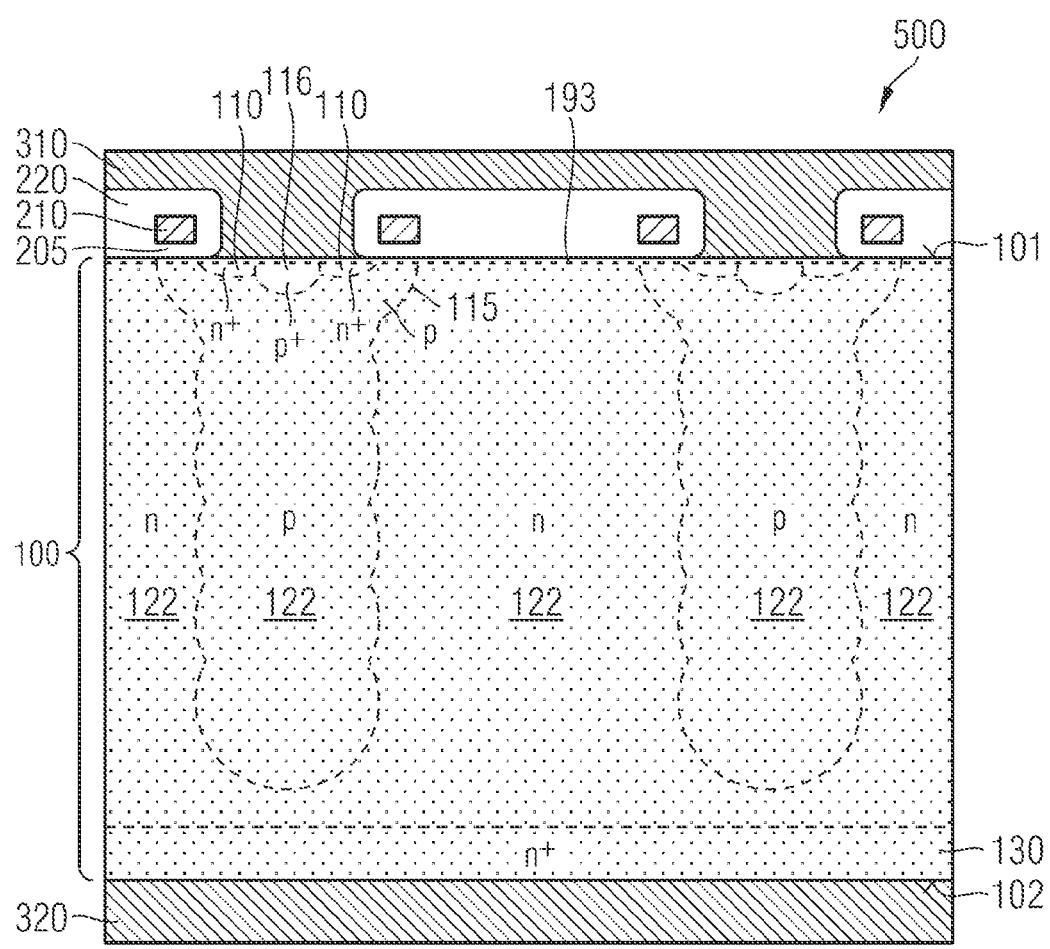
FIG. 4 is a schematic cross-sectional view of a portion of a super junction semiconductor device in accordance with an embodiment providing a recombination center accumulation zone.

FIG. 4 shows a super junction semiconductor device 500 with the implanted zone forming a recombination center accumulation zone 193 permeating the substrate portion 100 almost completely. The recombination center accumulation zone 193 may be formed by implanting first auxiliary impurities capable of forming recombination centers that locally promote the recombination of charge carriers and, as a consequence, locally reduce charge carrier lifetime in the drift layer 120. The recombination center accumulation zone 193 may be formed in the cell area 610, the edge area 690 or both.

The first auxiliary impurities may be heavy metal atoms/ions, e.g. platinum Pt or gold Au. According to an embodiment, the first auxiliary impurities are protons or helium atoms/ions. The recombination center accumulation zone 193 may extend from the second surface 102 to at least half of the distance between the first and the second surfaces 101, 102. Since the substrate portion 100 is thinner than 175 micrometers, acceleration voltages between 1 and 4 MeV suffice to obtain an almost complete and homogeneous recombination center accumulation zone 193 within the semiconductor portion 100 by an ion beam implant through the second surface 102.

In an on-state or forward mode with the pn-junction between the base zone 115 and the drift layer 120 forward biased, charge carriers diffuse into the drift layer 120 which have to be drained off from the drift layer 120 when the pn-junction changes from the forward-biased state to the reverse-biased state. Shortening charge carrier lifetime results in that fewer charge carriers have to drained off and in a faster evacuation. In other words, additional recombination centers increase the robustness of a reverse diode formed at the pn-junction between the body zone 115 and the drift layer 120 in the reverse mode.

The implanted zones of the super junction semiconductor devices 500 of FIGS. 5A and 5B form commutation enhancement zones 195 including second auxiliary impurities capable of locally reducing the emitter efficiency in an edge area 690 of the semiconductor portion 100.

According to FIG. 5A the second auxiliary impurities are impurities that disturb the crystal lattice of the semiconductor material. The second auxiliary impurities may be atoms of elements that are adapted to increase the scattering of charge carriers in the drift layer 120. For example, the second auxiliary impurities are atoms/ions that cause alloy scattering by substituting atoms of the semiconductor material of the semiconductor portion 100 in the crystal lattice. For example, the drift layer 120 is provided from silicon and the second auxiliary impurity atoms are selected from a group including germanium Ge, carbon C, Argon Ar atom/ions which replace some of the silicon atoms in the silicon crystal lattice in the drift layer 120. The commutation enhancement zone 195 decreases charge carrier injection into the edge area 690 and reduces the number of free charge carriers in the edge area 690 in the conductive mode (on-state or forward mode). If the semiconductor device 500 changes into the blocking mode, less charge carriers have to be drained off out of the edge area. In other words, the commutation enhancement zone 195 enhances the switching characteristics of the semiconductor device 500 without adversely affecting its on-state characteristics.

The commutation enhancement zone 195 may be formed in the complete edge area 690 or exclusively in an outer edge portion 699 of the edge area 690. The maximum impurity concentration is provided at a distance to the second surface 102 to avoid re-crystallization processes induced by a metallization providing the second electrode structure 320.

FIG. 5B shows a semiconductor device 500 with the second auxiliary impurities being impurities of the second conductivity type. For example, if the conductivity type of the first super junction regions 121 is the p-type, the second auxiliary impurities are atoms of a p-type donator, e.g. boron B. The resulting commutation enhancement zone 195 may form a segmented zone with portions of the drain layer 130 separating the segments. A metal structure 322 adjoining the second surface 102 in at least a portion of the edge area 690 may electrically connect the commutation enhancement zone 195 with doped structures of the first conductivity type, e.g. isolated segments of the drain layer 130. The metal structure 322 may be spatially separated and electrically insulated from the second electrode structure 320. According to another embodiment, the metal structure 322 is electrically connected to or electrically coupled with the second electrode structure 320.

Other than the counter-doped islands 132 of FIGS. 3A to 3F, the commutation enhancement zone 195 is not connected to the second electrode structure 320 and therefore does not emit holes under high voltage or high current conditions. Instead, together with the heavily doped n-regions they act as recombination structure for any carriers in this region provided that both types of heavily doped regions are in ohmic connection, e.g. via the metal structure 322.

Figure 6A:
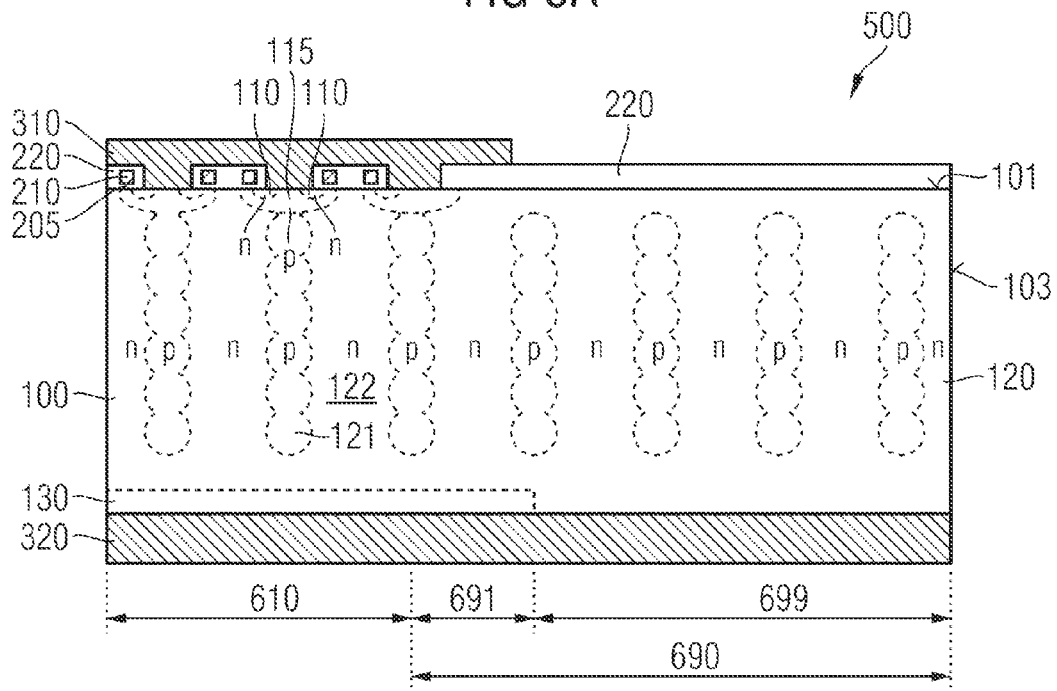
FIG. 6A is a schematic cross-sectional view of a portion of a super junction semiconductor device in accordance with an embodiment providing a patterned drain layer.
Figure 6B:
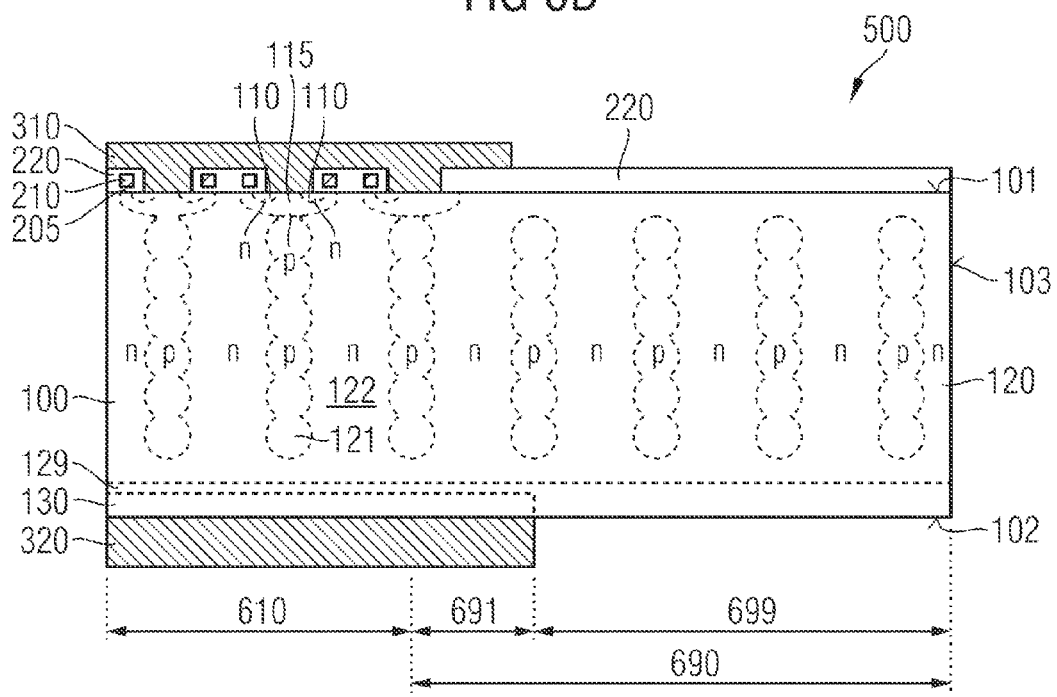
FIG. 6B is a schematic cross-sectional view of a portion of a semiconductor device in accordance with an embodiment providing a patterned second electrode structure.

FIGS. 6A and 6B refer to a super junction semiconductor device 500 with a semiconductor portion 100 having a first surface 101 and a second surface 102 parallel to the first surface 101. The semiconductor portion 100 includes a drain layer 130 of a first conductivity type and may directly adjoin the second surface 102. Columnar first super junction regions 121 of a second, opposite conductivity type extend in a direction perpendicular to the first surface 101. Columnar second super junction regions 122 of the first conductivity type separate the first super junction regions 121 from each other. The first and second super junction regions 121, 122 form a super junction structure. A distance between the first super junction regions 121, 122 and the second surface 102 does not exceed 30 µm. For example, the distance is at most 20 µm. The distance between the first and second surfaces 101, 102 is less than 175 µm, for example at most 100 µm.

The drain layer 130 is exclusively provided in a cell area 610 and is absent in the whole edge area 690 surrounding the cell area 610 or at least in an outer edge portion 699 of the edge area 690. The drain layer 130 has an implant impurity profile such that its peak concentration may be at a distance to the second surface 102 or at the second surface 102. The first and second super junction regions 121, 122 are provided in the cell area 610, may be completely absent in the edge area 690, or may be formed in an inner edge portion 691 directly adjoining to the cell area 610. The columnar first super junction regions 121 may form stripes having a length in a first lateral direction which is at least twice or ten times a lateral extension in a second lateral direction perpendicular to the first lateral direction. According to other embodiments, the first super junction regions 121 may have approximately circular, oval, ellipsoid or rectangular cross-sections wherein the second super junction regions 122 form a grid embedding the first super junction regions 121.

At least one structure or component allowing an on-state or forward current to flow in the second super junction regions 122 of the cell area 610, for example a gate electrode, a source zone, a source contact, a base zone or a gate contact, is either not provided in the edge area 690, or is without connection or inoperable for other reasons.

Typical super junction devices relying on substrate portions 100 having a thickness of more than 150 µm are based on a heavily doped substrate layer extending over the whole cross-section of the semiconductor portion 100. When a body pn-junction between the base zones 115 and the drift layer 120 of the embodiment is forward biased, charge carriers may diffuse into the edge area 690. When the body pn-junction changes from the forward-biased state to the reverse-biased state, charge carriers stored in the edge areas 690 have to be drained off by the super junction structures disposed directly adjoining the edge area 690. The charge carriers drained off from the edge area 690 add to the charge carriers which must be drained off from the cell area 610 and may significantly increase current densities in a border portion of the cell area 610 adjoining the edge area 690. For example, the charge carriers in the edge area 690 cannot be drained off completely in a vertical direction but flow also in a horizontal direction. The resulting voltage drop generates electrical field maxima which may locally destroy the semiconductor device 500. Since the embodiments rely on an implanted drain layer 130 generated by a masked implant from the side of the second surface 102 the drain layer 130 may be formed such that the drain layer 130 is absent in the edge area 690. As a result, no charge carriers are injected into the edge area 690 and at dynamic commutation lateral current densities are at least reduced or completely avoided. The embodiment may be combined with any of the super junction structures, field stop structures, counter-doped islands, commutation enhancement zones and/or recombination center accumulation zones described above.

According to an embodiment, the drain layer 130 may be annealed by a locally effective laser fusion process such that the super junction structure is not subjected to a thermal budget resulting from the drain layer formation. The second electrode structure 320 may extend over both the cell area 610 and the edge area 690.

According to the embodiment of FIG. 6B, the second electrode structure 320 is absent in at least a portion of the edge area 690, for example at least in the outer edge portion 699.

Figure 7:
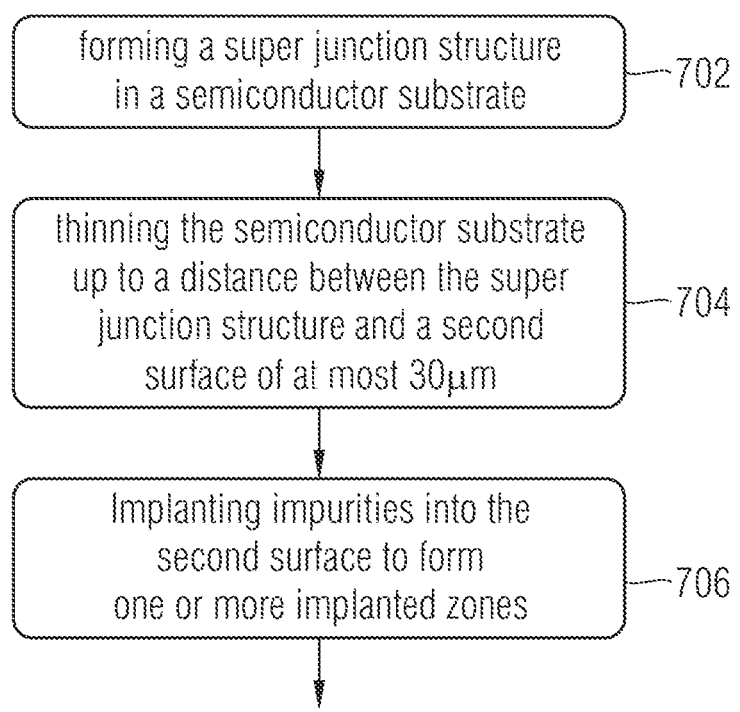
FIG. 7 is a simplified flow chart of a method of manufacturing a super junction semiconductor device.

FIG. 7 refers to a method of manufacturing a super junction semiconductor device. In a semiconductor substrate with a first surface and a working surface parallel to the first surface, columnar first and second super junction regions of a first and a second conductivity type are formed (702). The first and second super junction regions extend in a direction perpendicular to the first surface and form a super junction structure. The semiconductor portion is thinned such that, after the thinning, the distance between the first super junction regions having the second conductivity type and a second surface resulting from the working surface does not exceed 30 μm (704). Impurities of the first conductivity type are implanted into the second surface to form one or more impurity zones between the super junction structure and the second surface (706).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device comprising:
   a semiconductor portion with a first surface and a second surface parallel to the first surface, the semiconductor portion comprising
   a drain layer of a first conductivity type formed at least in a cell area;
   columnar first super junction regions of a second, opposite conductivity type, extending in a direction perpendicular to the first surface and separated by columnar second super junction regions of the first conductivity type, the first and second super junction regions forming a super junction structure between the first surface and the drain layer, wherein a distance between the first super junction regions and the second surface does not exceed 30 μm; and
   one or more implanted zones directly adjoining or overlapping the drain layer.

2. The super junction semiconductor device according to claim 1, wherein
   the one or more implanted zones form a field stop structure that is of the first conductivity type, directly adjoins the drain layer and has a mean impurity concentration which is at most 10% of the maximum impurity concentration in the drain layer.

3. The super junction semiconductor device according to claim 2, wherein
   the one or more implanted zones contain atoms/ions selected from a group containing hydrogen, helium, selenium, and sulfur.

4. The super junction semiconductor device according to claim 2, wherein
   the field stop structure extends into the first super junction regions.

5. The super junction semiconductor device according to claim 1, wherein
   the one or more implanted zones form counter-doped islands of the second conductivity type, the counter-doped islands directly adjoining the second surface and being separated by portions of the drain layer.

6. The super junction semiconductor device according to claim 5, wherein
   the counter-doped islands are absent in an edge area surrounding the cell area.

7. The super junction semiconductor device according to claim 1, wherein
   the one or more implanted zones form a recombination center accumulation zone in the cell area and contain first auxiliary impurities capable of locally reducing charge carrier lifetime, the recombination center accumulation zone extending from the second surface to at least a half of the distance between the first and the second surfaces.

8. The super junction semiconductor device according to claim 1, wherein
   the one or more implanted zones form a commutation enhancement zone in an edge area surrounding the cell area and contain second auxiliary impurities capable of generating alloy scattering by substituting atoms of a crystal lattice of the semiconductor portions.

9. The super junction semiconductor device according to claim 8, wherein
   the second auxiliary impurities are selected from a group consisting of argon Ar, carbon C, and germanium Ge atoms/ions.

10. The super junction semiconductor device according to claim 8, wherein
    the second auxiliary impurities are dopants of the second conductivity type.

11. The super junction semiconductor device according to claim 10, comprising:
    a metal structure electrically connecting the commutation enhancement zone with doped structures of the first conductivity type.

12. The super junction semiconductor device according to claim 1, wherein
    the super junction semiconductor device is an insulated gate field effect transistor and the drain layer directly adjoins the second surface.

13. A super junction semiconductor device comprising:
    a semiconductor portion with a first surface and a second surface parallel to the first surface, the semiconductor portion comprising
    a drain layer of a first conductivity type located in a cell area and absent in an edge area surrounding the cell area; and
    columnar first super junction regions of a second, opposite conductivity type extending in a direction perpendicular to the first surface and separated by columnar second super junction regions of the first conductivity type, the first and second super junction regions forming a super junction structure between the first surface and the drain layer, wherein a distance between the first super junction regions and the second surface does not exceed 30 µm.

14. The super junction semiconductor device according to claim 13, comprising:
  a rear side metal structure directly adjoining the second surface in the cell area and absent in at least an outer portion of the edge area, the outer portion directly adjoining an outer surface of the semiconductor portion, the outer surface connecting the first and second surfaces.

15. The super junction semiconductor device according to claim 13, comprising:
  a field stop zone directly adjoining the drain layer.

16. The super junction semiconductor device according to claim 13, wherein
  the super junction semiconductor device is an insulated gate field effect transistor and the drain layer directly adjoins the second surface.

\* \* \* \* \*